United States Patent [19]

Asahina et al.

[11] Patent Number: 5,278,436
[45] Date of Patent: Jan. 11, 1994

[54] SEMICONDUCTOR INTEGRATED CIRCUIT DEVICE FOR FORMING LOGIC CIRCUIT INCLUDING RESISTANCE ELEMENT CONNECTED TO BIPOLAR TRANSISTOR WITH SMALLER OCCUPIED AREA

[75] Inventors: Katsushi Asahina; Masahiro Ueda, both of Hyogo, Japan

[73] Assignee: Mitsubishi Denki Kabushiki Kaisha, Tokyo, Japan

[21] Appl. No.: 739,144

[22] Filed: Aug. 1, 1991

[30] Foreign Application Priority Data

Aug. 8, 1990 [JP] Japan .................. 2-211367

[51] Int. Cl.⁵ .................. H01L 27/02; H01L 27/10
[52] U.S. Cl. .................. 257/205; 257/206; 257/370; 257/378; 257/379
[58] Field of Search .................. 257/205, 206, 370, 378, 257/379, 380, 202, 204

[56] References Cited

U.S. PATENT DOCUMENTS 4,958,213 9/1990 Eklund et al. .................. 257/379
5,066,996 11/1991 Hara et al. .................. 257/205

FOREIGN PATENT DOCUMENTS

0125504B1 11/1984 European Pat. Off. .
0336741A2 10/1989 European Pat. Off. .
0439301A1 7/1991 European Pat. Off. .
3902641A1 8/1990 Fed. Rep. of Germany .

OTHER PUBLICATIONS

Hanibuchi et al, "A Bipolar-PMOS Merged Basic Cell for 0.8μm BiCMOS Sea-of-Gates", *IEEE 1990 Custom Integrated Circuits Conference*, pp. 4.2.1-4.2.4 .

Primary Examiner—J. Carroll
Attorney, Agent, or Firm—Lowe, Price, LeBlanc & Becker

[57] ABSTRACT

Disclosed is an improved Bi-CMOS gate array for increasing integration density. The gate array includes a predetermined region for forming PMOS transistors, a predetermined region for forming bipolar transistors, a predetermined region for forming resistance elements, and a predetermined region for forming NMOS transistors. The resistance element region is formed adjacent to the bipolar transistor region, and, therefore, it is not necessary to provide any interconnection for forming a logic circuit including the resistance element connected to the bipolar transistor. An area occupied by interconnections on the semiconductor substrate is thus reduced, and, therefore the integration density is increased.

10 Claims, 10 Drawing Sheets

SEMICONDUCTOR INTEGRATED CIRCUIT DEVICE FOR FORMING LOGIC CIRCUIT INCLUDING RESISTANCE ELEMENT CONNECTED TO BIPOLAR TRANSISTOR WITH SMALLER OCCUPIED AREA

BACKGROUND OF THE INVENTION

CROSS-REFERENCE TO RELATED, COPENDING APPLICATION

Related, copending application of particular interest to the instant application is U.S. Ser. No. 482,954, now U.S. Pat. No. 5,072,285, entitled "Semiconductor Integrated Circuit Having Region for Forming Complementary Field Effect Transistors and Region for Forming Bipolar Transistors and Method of Manufacturing the Same", filed Feb. 22, 1990 and assigned to the same assignee of the instant application.

FIELD OF THE INVENTION

The present invention relates generally to semiconductor integrated circuit devices, and more particularly, to a semiconductor integrated circuit device for forming a logical circuit including a resistance element connected to a bipolar transistor in a smaller occupied area. This invention has particular applicability to Bi-CMOS gate array devices.

DESCRIPTION OF THE BACKGROUND ART

A gate array is known as one of the most useful logic LSIs among various custom LSIs. The reason for often using the gate arrays for forming various logic circuits is that a desired logic LSI can be readily, in other words, less costly obtained by giving interconnections according to user demands to basic cells such as transistors, diodes, etc. formed on a semiconductor substrate.

Generally, a circuit formed of bipolar transistors generally consumes a large current, but can achieve high speed operation as well as large load driving performance. On the other hand, a circuit formed of CMOS transistors can not operate as fast as the bipolar transistor circuit but can operate with low current consumption, and achieve high density integration. A Bi-CMOS integrated circuit device is therefore formed of bipolar transistors and CMOS transistors formed on a single semiconductor substrate in order to get the best out of the advantages of the bipolar transistor circuit and CMOS transistor circuit. The Bi-CMOS integrated circuit device includes an input circuit for receiving an externally applied input signal having an emitter coupled logic (hereinafter "ECL") amplitude and driving the internal CMOS transistor circuit.

FIG. 9 is a block diagram showing a Bi-CMOS gate array showing the back ground of the present invention. Referring to FIG. 9, a Bi-CMOS gate array 70 includes a basic cell region 72 in which formed are a number of basic cells each including a PMOS transistor, an NMOS transistor and a bipolar transistor (not shown). ECL input/output circuits and CMOS input/output circuits are formed in an input/output circuit region 71 around basic cell region 72.

In the recent years, a so-called Bi-CMOS logic gate which combines CMOS transistors and bipolar transistors has been widely known as a logic gate capable of high speed operation with low power consumption. In the following, an NAND gate having two inputs will be described as an example of a Bi-CMOS logic gate.

FIG. 6 is a circuit diagram showing a conventional NAND gate having two inputs. Referring to FIG. 6, a PMOS transistor MP1 has its source and substrate connected to a power supply potential Vcc. A PMOS transistor MP2 has also its source and substrate connected to a power supply potential Vcc. The drains of transistors MP1 and MP2 are connected together to the base of an npn transistor Q1. Transistor Q1 has its collector connected to a power supply potential Vcc and its emitter connected to an output terminal Y. PMOS transistor MP3 has its source connected to the base of transistor Q1, its drain connected to the emitter of transistor Q1, its gate connected to a ground potential GND, and its substrate connected to power supply potential Vcc. An NMOS transistor MN1 has its drain connected to the emitter of transistor Q1 and its source connected to the drain of a transistor MN2. NMOS transistor MN2 has its source connected to a ground potential GND. Transistors MN1 and MN2 have their substrates connected together to ground potential GND. The gates of transistors MP1 and MN1 are connected together to an input terminal A. Transistors MP2 and MN2 have their gates connected together to an input terminal B.

Now, the operation will be described. When input terminals A and B are each supplied with an H level signal, transistors MN1 and MN2 are turned on. A base current does not flow through the base of transistor Q1, because transistors MP1 and MP2 are turned off at that time. As a result, output terminal Y is brought into an L level.

When an L level signal is applied to one or both of input terminals A and B, one or both of transistors MP1 and MP2 are turned on. A base current flows through the base of transistor Q1. One or both of transistors MN1 and MN2 are turned off, and output terminal Y attains an H level as a result. The potential of output terminal Y rises as high as the power supply potential, because transistor MP3 is also turned on at the time.

When both input signals applied to input terminals A and B each attain an H level, the base of transistor Q1 is discharged through transistors MP3, MN1 and MN2 to ground GND.

FIG. 7 is a layout showing the inside of the gate array of the NAND gate shown in FIG. 6. In the case shown in FIG. 7, the basic cells of the gate array form the NAND gate. Referring to FIG. 7, a power supply potential Vcc is supplied to an interconnection layer 4, and a ground potential GND is supplied to an interconnection layer 5. Insulating films (not shown) are formed on a PMOS transistor region 51, and gate electrodes 6a are formed on the insulating films, thereby forming PMOS transistors. Similarly, insulating films (not shown) are formed in an NMOS transistor region 54, and gate electrodes 6b are formed on the insulating films, thereby constituting NMOS transistors. Transistors MP1, MP2 and MP3 are formed in PMOS transistor region 51. Transistor Q1 is formed in an NPN bipolar transistor region 52a. Transistors MN1 and MN2 are formed in NMOS transistor region 54.

As shown in FIG. 6, in the conventional NAND gate, PMOS transistor MP3 is necessary for discharging the base of transistor Q1. Transistor MP3 must therefore be formed in region 51 shown in FIG. 7, hampering the implementation of high density integration in layout.

SUMMARY OF THE INVENTION

It is therefore an object of the present invention to increase the integration density of semiconductor integrated circuit devices forming a logic circuit including a resistance element connected to bipolar transistors.

Another object of the present invention is to increase the integration density of Bi-CMOS gate arrays forming a logic circuit including a resistance element connected to bipolar transistors.

Simply stated, a semiconductor integrated circuit device in accordance with the present invention forms a logic circuit including a resistance element connected to a bipolar transistor. The semiconductor integrated circuit device includes a semiconductor substrate having a main surface, a first predetermined field effect transistor region formed on the main surface of the substrate for forming a train of a plurality of field effect transistors of a first conductivity type in a predetermined first direction on the main surface, a second predetermined field effect transistor region formed on the main surface of the substrate for forming a train of a plurality of field effect transistors of a second conductivity type in the first direction, a predetermined bipolar transistor region formed on the main surface of the substrate and between the first and second field effect transistor regions for forming a train of a plurality of bipolar transistors in the first direction, and a predetermined resistance element region formed on the main surface of the substrate and between the first and second field effect transistor regions for forming a train of a plurality of resistance elements in the first direction. The resistance element region is adjacent to and is electrically connected to the bipolar transistor region. The logic circuit has the bipolar transistor formed in the bipolar transistor region and the resistance element formed in the resistance element region.

It is not necessary to connect the bipolar transistor and the resistance element by interconnections for forming the logic circuit, because the resistance element region is adjacent to the bipolar transistor region and is electrically connected thereto. The interconnection area is therefore reduced, thereby increasing integration density in the circuit.

In accordance with another aspect of the present invention, a semiconductor integrated circuit device includes a semiconductor substrate, a first predetermined field effect transistor region formed on the substrate for forming a train of a plurality of field effect transistors of a first conductivity type in a predetermined first direction, a second predetermined field effect transistor region formed on the substrate for forming a train of a plurality of field effect transistors of a second conductivity type in the first direction, a bipolar transistor region formed on the substrate and between the first and second field effect transistor regions for forming a train of a plurality of bipolar transistors in the first direction, and a predetermined resistance element region formed on the substrate and between the first and second field effect transistor regions for forming a train of a plurality of resistance elements in the first direction. The resistance element region is adjacent to the bipolar transistor region and is electrically connected thereto.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
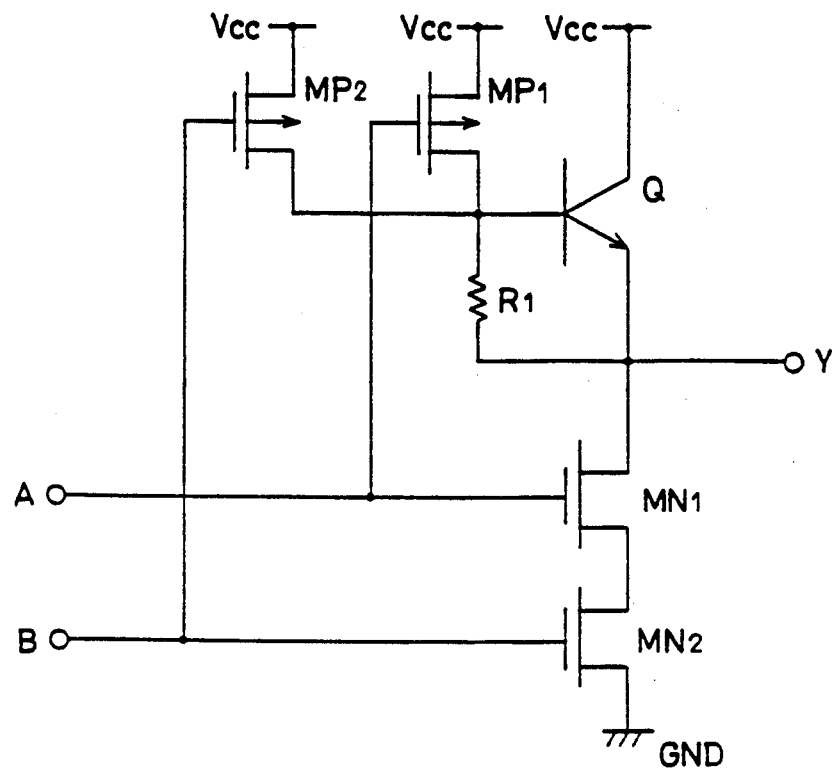
FIG. 2 is a circuit diagram showing the NAND gate shown 1 in FIG. 1.
Figure 6:
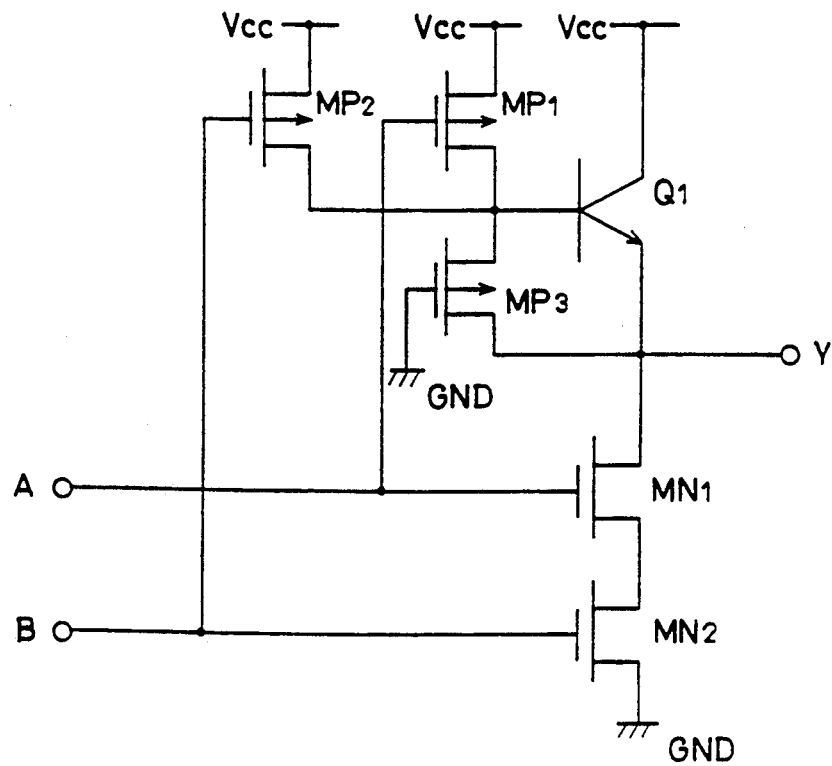
FIG. 6 is a circuit diagram showing a conventional NAND gate.

Referring to FIG. 2, a PMOS transistor MP1 has its source and substrate connected to a power supply potential Vcc. Likewise, a PMOS transistor MP2 has its source and substrate connected to a power supply potential Vcc. Transistors MP1 and MP2 have their drains connected together to the base of transistor Q1. Npn transistor Q1 has its collector connected to a power supply potential Vcc, its emitter connected to an output terminal Y. A resistance element R1 is connected between the base and emitter of transistor Q1. An NMOS transistor MN1 has its drain connected to the emitter of transistor Q1, its source connected to the drain of an NMOS transistor MN2. Transistor MN2 has its source connected to a ground potential GND. Transistors MN1 and MN2 has their substrates connected together to ground potential GND. Transistors MP1 and MN1 has their gates connected together to an input terminal A. Transistors MP2 and MN2 have their gates connected together to an input terminal B.

Now, the operation will be described. When input terminals A and B are each supplied with an H level input signal, transistors MN1 and MN2 are turned on. A base current does not flow through the base of transistor Q1, because transistors MP1 and MP2 are also turned on at that time. As a result, output terminal Y is brought into an L level.

One or both of input terminals A and B are supplied with an L level input signal, one or both of transistors MP1 and MP2 are turned on. A base current flows through the base of transistor Q1 accordingly. One or both of transistors MN1 and MN2 are turned off. Consequently, output terminal Y attains an H level. The potential of output terminal Y rises as high as power supply potential Vcc, because a resistor R1 is connected between the base and emitter of transistor Q1.

When both of input signals applied to input terminals A and B attain an H level, the base of transistor Q1 is discharged to ground potential GND through resistor R1, and transistors MN1 and MN2.

Figure 1:
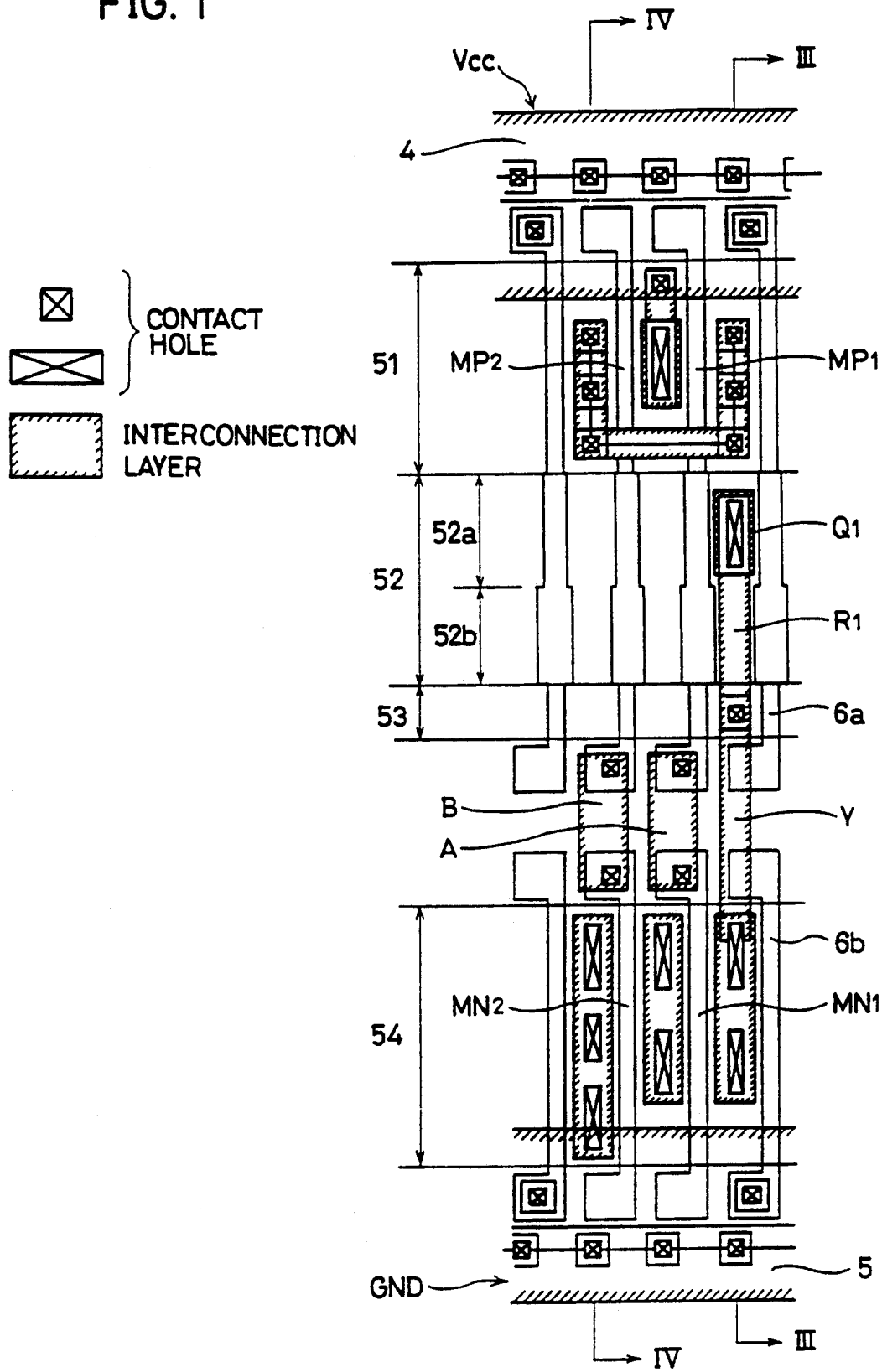
FIG. 1 is a layout showing a gate array in accordance with one embodiment of the present invention.

A layout of a gate array in accordance with one embodiment of the present invention is shown in FIG. 1. Referring to FIG. 1, transistors MP1 and MP2 are formed in a PMOS transistor region 51. Transistor Q1 and resistance element R1 are formed in a region 52. Region 52 includes an NPN bipolar transistor region 52a and a resistance element region 52b. A region 53 is a region for connecting resistance element R1 to an interconnection layer. Transistors MN1 and MN2 are formed in an NMOS transistor region 54. Regions 51, 52a and 54 correspond to regions 51, 52a and 54 shown in FIG. 7, respectively.

It is to be especially noted in FIG. 1 that resistance element region 52b is formed adjacent to NPN bipolar transistor region 52a. In practice, these regions 52a and 52b are formed as a P. diffusion layer in the same process. In addition, region 53 is formed for connecting one end of resistance element region 52b to an interconnection layer.

Figure 3A:
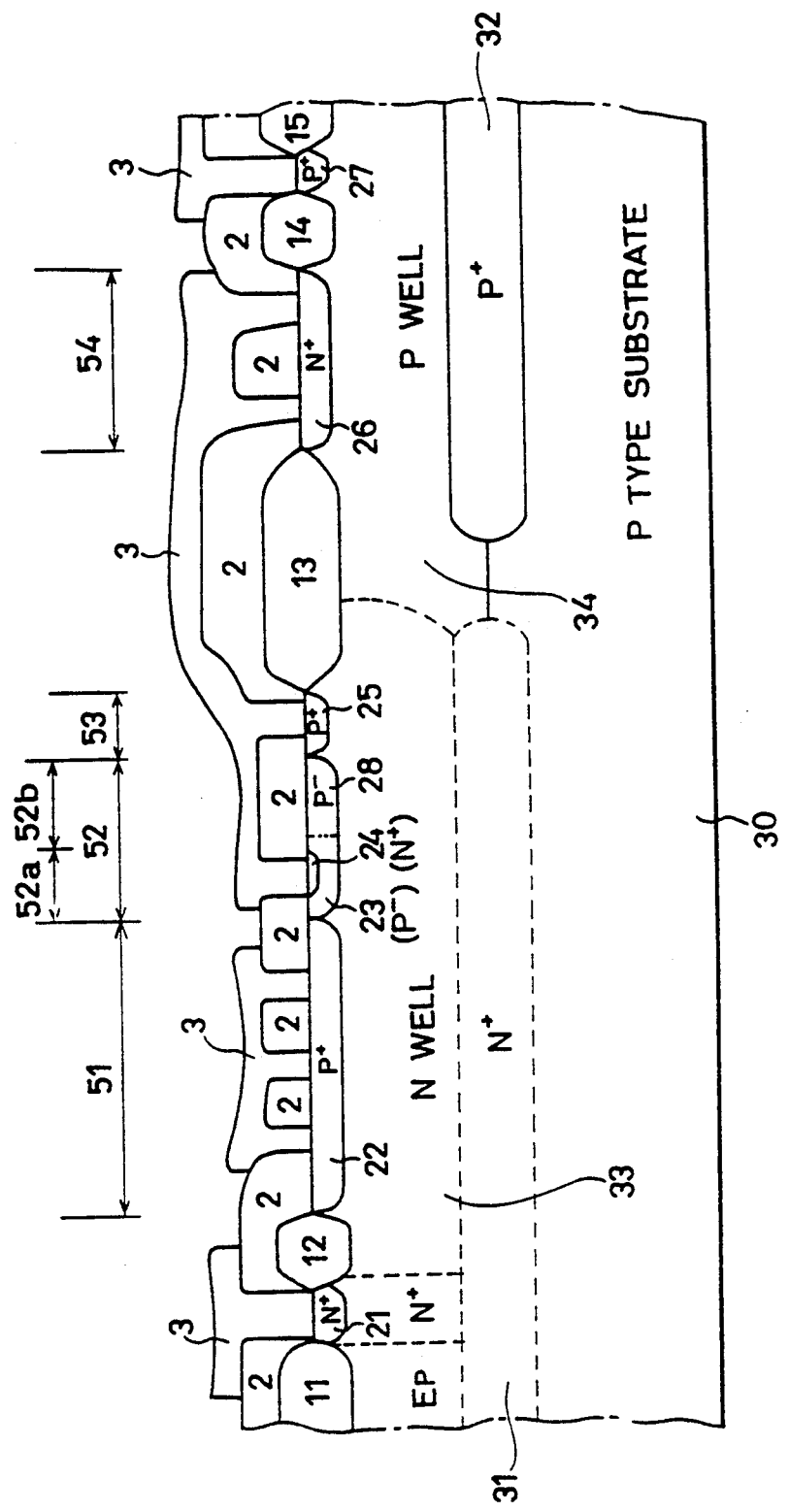
FIG. 3A is a sectional view showing the structure taken III—III shown in FIG. 1.

FIG. 3A is a sectional view taken along line III—III shown in FIG. 1. Referring to FIG. 3A, an epitaxial layer Ep is formed on the surface of a P type substrate 30. An N+ buried layer 31 and a P+ buried layer 32 are formed a prescribed distance separated from each other between substrate 30 and epitaxial layer Ep. An N well 33 is formed in epitaxial layer Ep on buried layer 31, and a P well 34 is formed on buried layer 32. Element isolation oxide film layers 11 to 15 are formed on the surface of epitaxial layer Ep a suitable distance apart from each other. An N+ diffusion layer 21 is formed between oxide film layers 11 and 12 as a region for conducting N well 3. A P+ diffusion layer 22 is formed as a region for forming the source/drain electrodes of PMOS transistors in region 51. P− diffusion layers 23 and 28 are formed in region 52. Diffusion layers 23 and 28 are formed integrally as well as simultaneously. Diffusion layer 23 is formed in region 52a and is used as a base region for NPN bipolar transistors. Diffusion layer 28 is formed in region 52b, and is for forming P type diffusion resistance elements An N+ diffusion layer 24 forming the emitter of the NPN bipolar transistor is formed in diffusion layer 23. In region 53, a P+ diffusion layer 25 is formed as an electrode region for diffusion layer 28 forming the resistance element. An N+ diffusion layer 26 is formed between oxide film layers 13 and 14 as the source/drain electrode region of the NMOS transistor in region 54. A P+ diffusion layer 27 is formed between oxide film layers 14 and 15 as a region for conducting P well 34. Diffusion layer 21 functions as an electrode for fixing the substrate potential of the PMOS transistor formed in region 51 and as a collector electrode for the NPN bipolar transistor formed in region 52a as well. The substrate of the PMOS transistor is brought into the power supply potential Vcc, and, therefore, the collector of the NPN bipolar transistor is fixed at the power supply potential Vcc.

P+ diffusion layer 22, P+ diffusion layers 23 and 28, and P+ diffusion layer 25 are separated from each other by two gate electrodes 6a adjacent to each other shown in FIG. 1, and, therefore, it is not possible to electrically disconnect between P+diffusion layer 22 and P− diffusion layer 23, and between P− diffusion layer 28 and P+ diffusion layer 25. P+ diffusion layer 22 in the source/drain electrode region of the PMOS transistor in region 51 is therefore connected to the base of the NPN bipolar transistor in region 52a. P+ diffusion layer 22 in the source/drain electrode region in the PMOS transistor in region 51 also functions as an electrode for conducting the base of the NPN bipolar transistor in region 52a.

Also, the base of the NPN bipolar transistor in region 52a is the same as P− diffusion layer 28 for forming a P type diffusion resistor in region 52b, and, therefore, the base of the NPN bipolar transistor and the source/drain of the PMOS transistor are electrically connected to each other. Likewise, P− diffusion layer 28 for forming a P type diffusion resistor in region 52b and P+ diffusion layer 25 as an electrode region for a P type diffusion resistor in region 53 are electrically connected to each other.

Figure 3B:
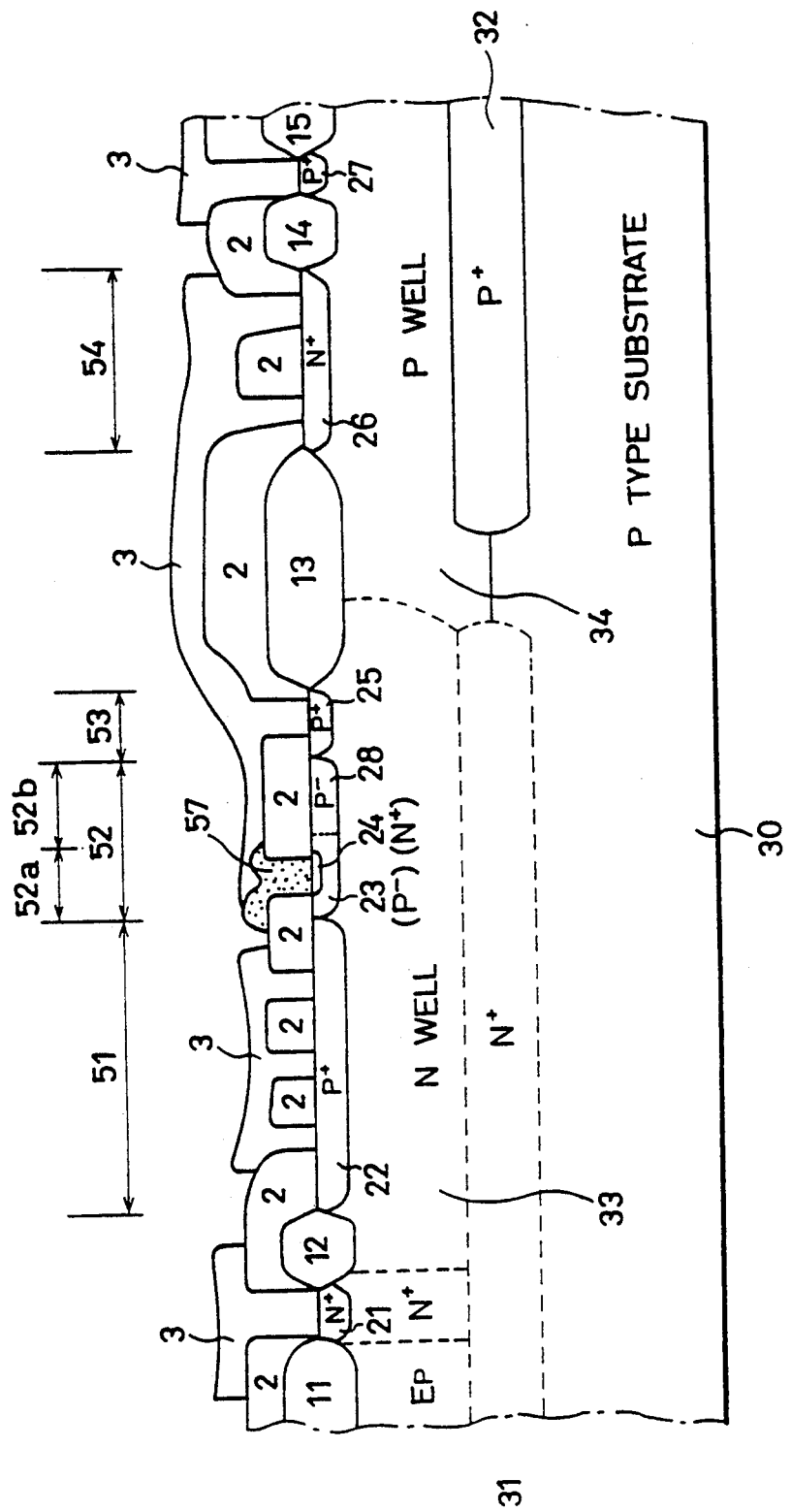
FIG. 3B is a sectional view showing the structure of a gate array in accordance with another embodiment of the percent invention.
Figure 4:
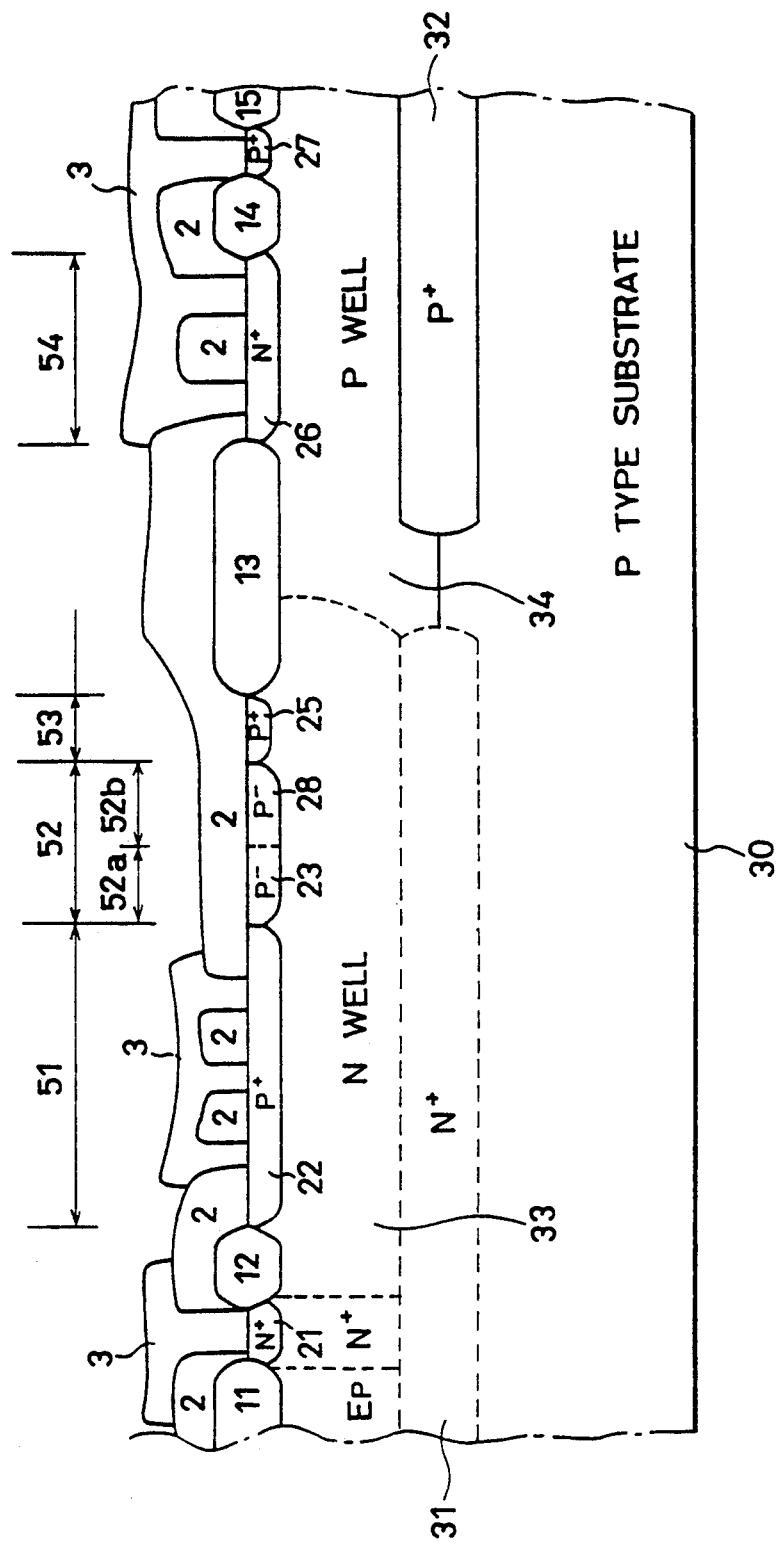
FIG. 4 is a sectional vies showing a structure taken along the line IV—IV shown in FIG. 1.

FIG. 4 is a sectional view taken along line IV—IV shown in FIG. 1. In FIG. 4, the structure of portions corresponding to the structure shown in FIG. 3 is illustrated in section.

Figure 5:
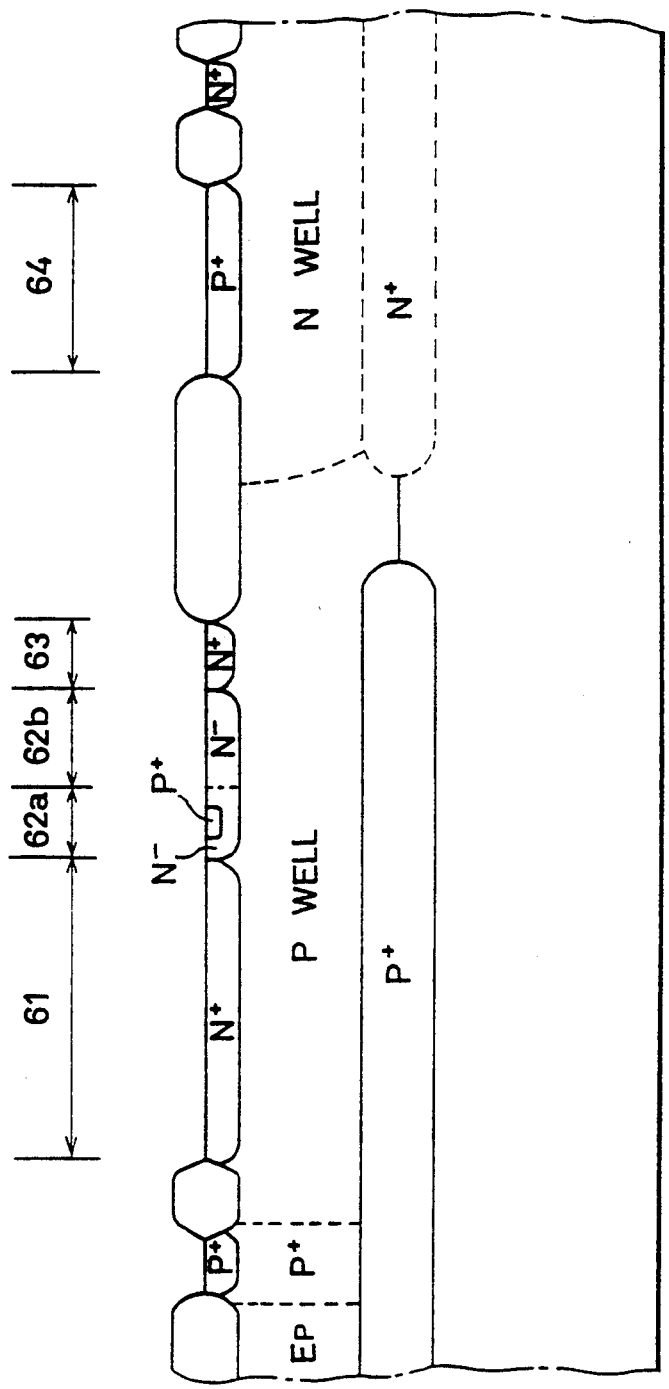
FIG. 5 is a sectional view showing the structure of a gate array in accordance with another embodiment of the present invention.

In the embodiment shown in FIG. 2, description was given on the case in which an NPN bipolar transistor and a P type diffusion resistance element are formed in a PMOS transistor region, and it is pointed out that the present invention can be applied to a gate array having a complementary sectional structure to this embodiment. More specifically, as shown in FIG. 5, a PNP bipolar transistor and an N type diffusion resistance element are formed in an NMOS transistor region. Regions 61, 62a, 62b, 63 and 64 correspond to regions 51, 52a, 52b, 53 and 54 shown in FIG. 3, respectively. In the embodiment shown in FIG. 5, similar effects to the embodiment shown in FIG. 1 can be obtained. In any of the embodiments, as for the conductivity type of the semiconductor substrate, either P type or N type may be used.

Figure 7:
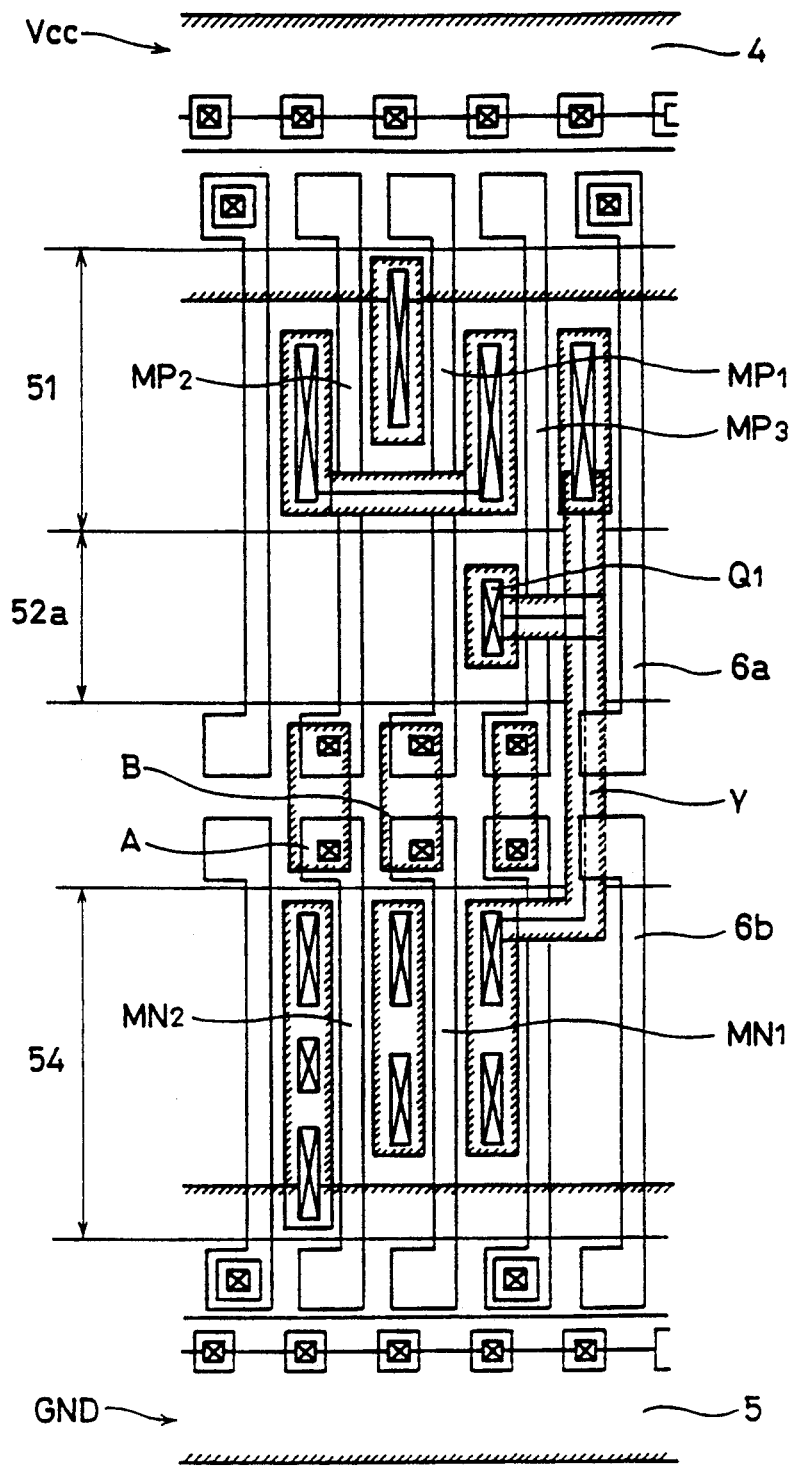
FIG. 7 is a layout showing the inside of the gate array of the NAND gate shown in FIG. 6.

As can be seem from the layout shown in FIG. 1, resistor R1 connected to the base of bipolar transistor Q1 is formed of P+ diffusion region 28 formed adjacent to P− diffusion region 23 forming the base as shown in FIG. 3, and, therefore an area occupied by the NAND gate will be reduced compared to the conventional layout shown in FIG. 7. In other words, the occupied area in the transverse direction in PMOS transistor region 51 will not be necessary, because resistor R1 is formed in alignment with bipolar transistor Q1. As a result, high density integration in the Bi-CMOS gate array can be achieved.

Referring to FIG. 3B, the sectional structure of a gate array representing another embodiment of the present invention is shown. When compared to the one shown in FIG. 3A, an emitter electrode 57 formed of polycrystalline silicon is provided between an N+ diffusion layer 24 and a metal interconnection 3. When metal interconnection 3 is directly connected to N. diffusion layer 24 as shown in FIG. 3A, N+ diffusion layer 24 is influenced by the formation of metal interconnection 3. In other words, an alloy may be formed by interconnection 3 and N+ diffusion layer 24, and a resultant bipolar transistor will not have desired characteristic for this reason. In an example shown in FIG. 3B, with emitter electrode 57 formed of polycrystalline silicon being provided, this problem is prevented, and, therefore desired characteristics can be obtained for the bipolar transistor.

Figure 8A:
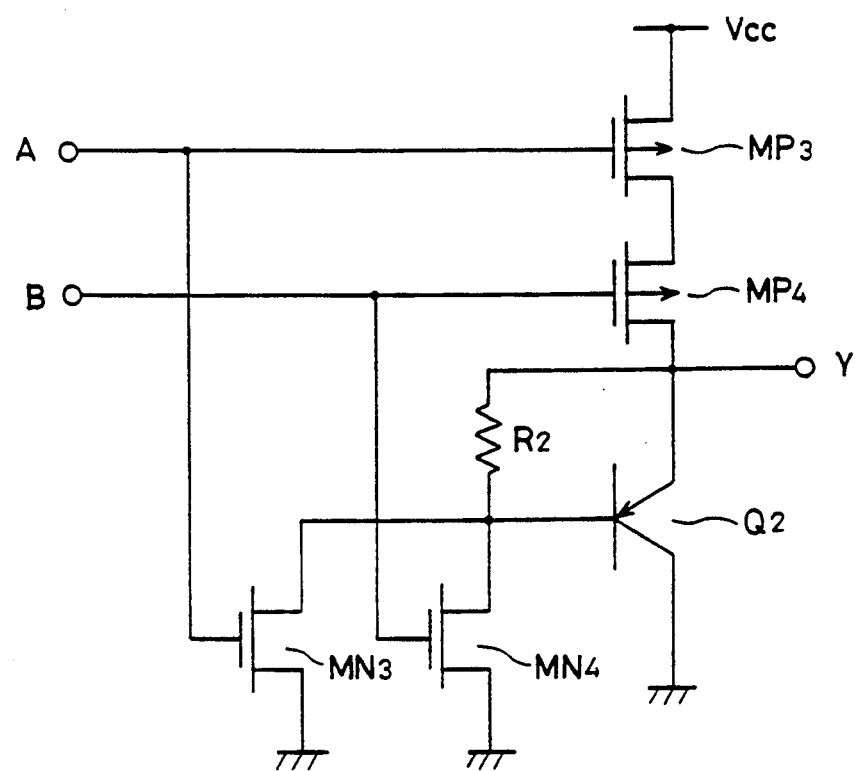
FIG. 8A is a circuit diagram showing a NOR gate.

FIG. 8A is a circuit diagram showing an NOR gate. The NOR gate includes PMOS transistors MP3 and MP4, NMOS transistors MN3 and MN4, a PNP transistor Q2, and a resistor element R2. The NOR gate shown in FIG. 8A is formed in the gate array as shown in FIG. 8B.

Figure 8B:
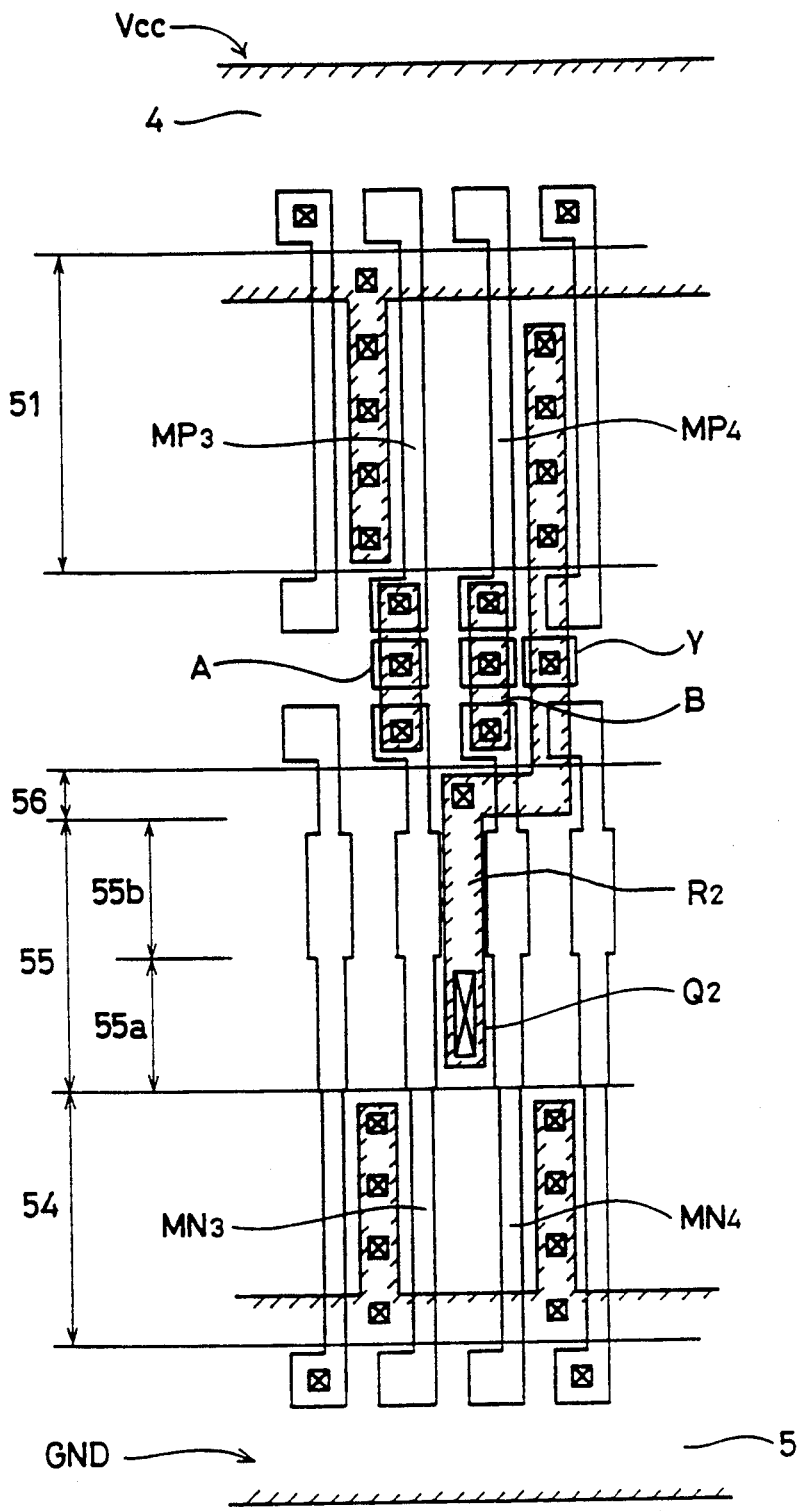
FIG. 8B is a layout showing the inside of the gate array of the NOR gate shown in FIG. 8A.
Figure 9:
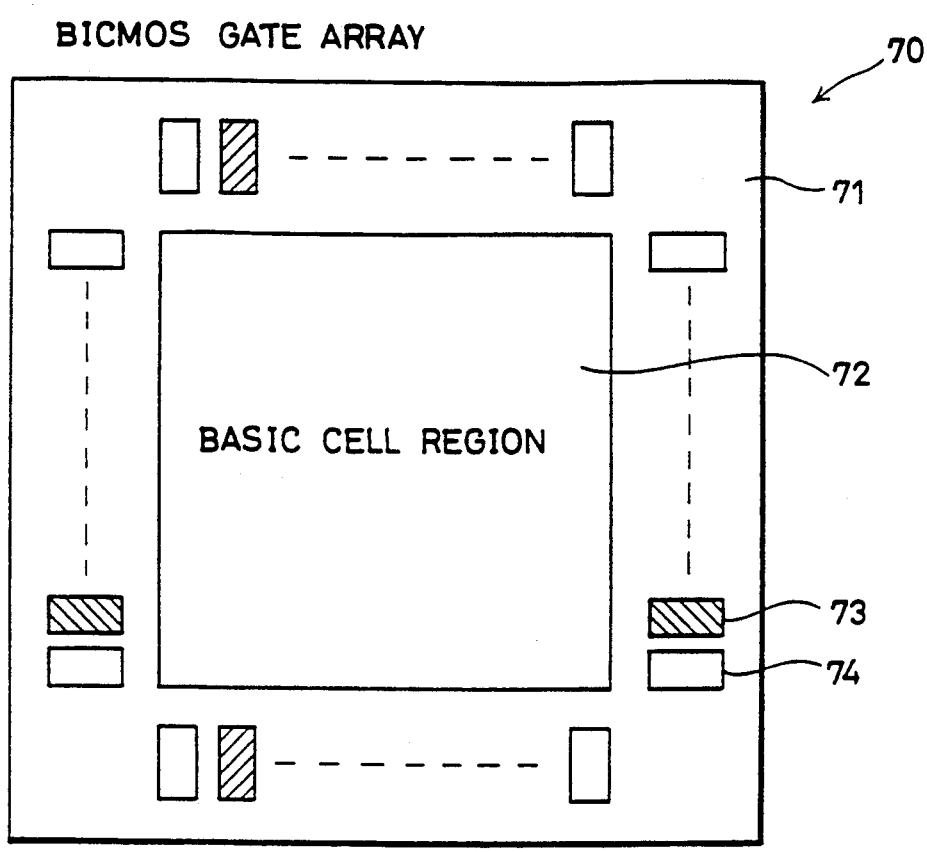
FIG. 9 is a block diagram showing a Bi-CMOS gate array for illustrating the background of the present invention.

Referring to FIG. 8B, a layout showing a gate array representing another embodiment of the present invention is set forth. Referring to FIG. 8B, transistors MP3 and MP4 are formed in a PMOS transistor region 51. Transistors MN3 and MN4 are formed in an NMOS transistor region 54. A bipolar transistor region 55a is formed adjacent to NMOS transistor region 54. A resistance element region 55b is formed adjacent to region 55a. Transistor Q2 and resistance element R2 shown in FIG. 8A are formed in regions 55a and 55b, respectively.

In operation, the base of transistor Q2 and resistance element R2 shown in FIG. 8A are connected together, because resistance element region 55b is formed adjacent to bipolar transistor region 55a. In other words, the base of transistor Q2 and resistance element R2 can be connected without providing any interconnection, and, therefore, integration density in the Bi-CMOS gate array can be increased.

In the foregoing, the cases have been described in which the present invention is applied to the NAND gate and NOR gate in the Bi-CMOS gate array, but it is noted that the scope of the present invention to be applied is by no means limited thereto. In other words, it is pointed out that the present invention is generally useful for achieving high density integration when a circuit having a resistance element connected to the base of a bipolar transistor is formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
    a semiconductor substrate;
    a first predetermined field effect transistor region formed on said substrate, for forming a train of a plurality of field effect transistors of a first conductivity type in a predetermined first direction;
    a second predetermined field effect transistor region formed on said substrate, for forming a train of a plurality of field effect transistors of a second conductivity type in said first direction;
    a predetermined bipolar transistor region formed on said substrate and between said first and second field effect transistor regions, for forming a train of a plurality of bipolar transistors in said first direction; and
    a predetermined resistance element region formed on said substrate and between said first and second field effect transistor regions, for forming a train of a plurality of resistance elements having longitudinal axes parallel to said first direction, said first and second field effect regions, bipolar transistor region and resistance element region forming a gate of said integrated circuit device,
    said resistance element region being adjacent and electrically connected to said bipolar transistor region.

2. A semiconductor integrated circuit device as recited in claim 1, wherein said semiconductor integrated circuit device comprises a gate array device.

3. A semiconductor integrated circuit device forming a logic circuit including a resistance element connected to a bipolar transistor, comprising:
    a semiconductor substrate having a main surface;
    a first predetermined field effect transistor region formed on the main surface of said substrate, for forming a train of a plurality of field effect transistors of a first conductivity type in a predetermined first direction on the main surface;
    a second predetermined field effect transistor region formed on the main surface of said substrate, for forming a train of a plurality of field effect transistors of a second conductivity type in said first direction;
    a predetermined bipolar transistor region formed on the main surface of said substrate and between said first and second field effect transistor regions, for forming a train of a plurality of bipolar transistors in said first direction; and
    a predetermined resistance element region formed on the main surface of said substrate and between said first and second field effect transistor regions, for forming a train of a plurality of resistance elements having longitudinal axes parallel to said first direction, said first and second field effect regions, bipolar transistors region and resistance element region forming a gate of said logic circuit,
    said resistance element region being adjacent and electrically connected to said bipolar transistor region.

4. A semiconductor integrated circuit device as recited in claim 1, wherein
    said bipolar transistor region includes an emitter layer, a base layer and a collector layer formed in a second direction vertical to the main surface of said substrate, and
    said resistance element region includes an impurity layer adjacent to and electrically connected to said base layer of said bipolar transistor region.

5. A semiconductor integrated circuit device as recited in claim 4, wherein said impurity layer has the same conductivity type as said base layer.

6. A semiconductor integrated circuit device as recited in claim 5, wherein said impurity layer has the same impurity concentration as said base layer.

7. A semiconductor integrated circuit device as recited in claim 4, wherein said logic circuit includes an NAND gate circuit including said bipolar transistor and said resistance element connected to the base of said bipolar transistor.

8. A semiconductor integrated circuit device as recited in claim 4, wherein said logic circuit includes an NOR gate circuit including said bipolar transistor and said resistance element connected to the base of said bipolar transistor.

9. A semiconductor integrated circuit device as recited in claim 3, further comprising a basic cell region formed on said substrate for forming basic cells,
    said first and second field effect transistor regions, bipolar transistor region and resistance element region being formed in said basic cell region.

10. A semiconductor integrate circuit device as recited in claim 3, wherein
    said train of the plurality of field effect transistors of the first conductivity type includes a train of a plurality of PMOS transistors, and
    said train of the plurality of field effect transistors of the second conductivity type include a train of a plurality of NMOS transistors.

* * * * *